(12) United States Patent  
Baharav et al.

(10) Patent No.: US 6,940,061 B2
(45) Date of Patent: Sep. 6, 2005

(54) TWO-COLOR PHOTO-DETECTOR AND METHODS FOR DEMOSAICING A TWO-COLOR PHOTO-DETECTOR ARRAY

(75) Inventors: Izhak Baharav, San Jose, CA (US); Philippe Longere, Goleta, CA (US); Dietrich W. Vook, Menlo Park, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/086,125

(22) Filed: Feb. 27, 2002

(65) Prior Publication Data

US 2003/0160157 A1 Aug. 28, 2003

(51) Int. Cl.[7] .................................................. G01J 3/50
(52) U.S. Cl. ..................... 250/226; 250/214.1; 348/272
(58) Field of Search ................................ 348/280, 272, 348/274, 315; 250/226, 208.1, 214.1, 208.2, 208.6; 257/440, 184; 356/406

(56) References Cited

U.S. PATENT DOCUMENTS

| | | | |
|---|---|---|---|
| 4,214,264 A | * 7/1980 | Hayward et al. | 348/512 |
| 4,404,586 A | 9/1983 | Tabei | |
| 4,513,305 A | * 4/1985 | Bloss et al. | 257/436 |
| 4,677,289 A | * 6/1987 | Nozaki et al. | 250/226 |
| 4,737,833 A | 4/1988 | Tabei | |
| 5,965,875 A | 10/1999 | Merrill | 250/226 |
| 5,998,806 A | 12/1999 | Stiebig et al. | 257/55 |
| 6,016,011 A | 1/2000 | Cao et al. | 257/773 |
| 6,018,187 A | 1/2000 | Theil et al. | 257/458 |
| 6,111,300 A | * 8/2000 | Cao et al. | 257/440 |
| 6,114,739 A | 9/2000 | Theil et al. | 257/458 |
| 6,215,164 B1 | 4/2001 | Cao et al. | 257/431 |
| 6,593,558 B1 | * 7/2003 | Edgar | 250/208.1 |

FOREIGN PATENT DOCUMENTS

| | | | |
|---|---|---|---|
| EP | 1006585 A1 | | 6/2000 |
| GB | 2166289 | * | 4/1986 |

OTHER PUBLICATIONS

Richard F. Lyon; *Prism–Based Color Separation for Professional Digital Photograph*; IS&T's 2000 PICS Conference; pp. 50–54.

(Continued)

*Primary Examiner*—David Porta
*Assistant Examiner*—Stephen Yam

(57) ABSTRACT

A two-color photo-detector capable of sensing two colors at a single photo-detector location is provided having a lower photo-detector element resident in the bulk silicon and an upper photo-detector element elevated above the lower photo-detector element. The color sensitivity of each of the photo-detector elements is determined according to the absorption curve of the upper photo-detector element, the thickness of the upper photo-detector element and the color filter array, if any. The elevated upper photo-detector element overlies the circuitry needed for both the upper photo-detector element and the lower photo-detector element. In order to accurately sample color within an array of two-color photo-detectors without a color filter array, two different thicknesses for the upper photo-detector elements of adjacent two-color photo-detectors are used. Therefore, each pair of two-color photo-detectors within the array senses four different colors (i.e., blue and the complement of blue and red and the complement of red). To process the raw color values for compression and storage, a simple color-conversion matrix can be used on a 2×2 block of two-color photo-detectors to convert the four colors (eight color values) to a new color space, such as YCbCr (4:1:1), without traditional demosaicing neighborhood operations.

18 Claims, 4 Drawing Sheets

OTHER PUBLICATIONS

D. Knipp, H. Stiebig, J. Fölsch and H. Wagner; *Four terminal color detector for digital signal processing*; 1998 Elsevier Science B. V.; pp. 1321–1325.

Matt Borg, Ray Mentzer and Kalwant Singh; *A High Image Quality Fully Integrated CMOS Image Sensor*; IS&T; pp. 1–6.

K.M. Findlater, P.B. Denyer, R.K. Henderson, J.E.D. Hurwitz, J.M. Raynor and D. Renshaw; *Buried double junction pixel using green and magenta filters*; 1998–1999; pp. 60–63.

K.M. Findlater, D. Rensaw, J.E.D. Hurwitz, R. K. Henderson, T.E.R. Bailey, S.G. Smith, M.D. Purcell and J.M. Raynor; *A CMOS Image Sensor Employing a Double Junction Photodiode*; IEEE Workshop on Charge–Coupled Devices and Advanced Image Sensors; Jun. 7–9, 2001; pp. 60–63.

M.D. Purcell, D. Renshaw, K.M. Findlater, J.E.D. Hurwitz, S.G. Smith and T.E.R. Bailey; *Hexagonal Array Processing*; IEEE Workshop on Charge–Coupled Devices and Advanced Image Sensors; Jun. 7–9, 2001; pp. 83–86.

Patrick C. Herzog, Dietmar Knipp, Helmut Stiebig and Friedhelm König; *Characterization of novel three and six channel color moiré free sensors*; Conference on Color Imaging: Device–Independent Color, Color Hardcopy, and Graphic Arts IV; SPIE vol. 3648; Jan. 1999; pp. 48–59.

\* cited by examiner

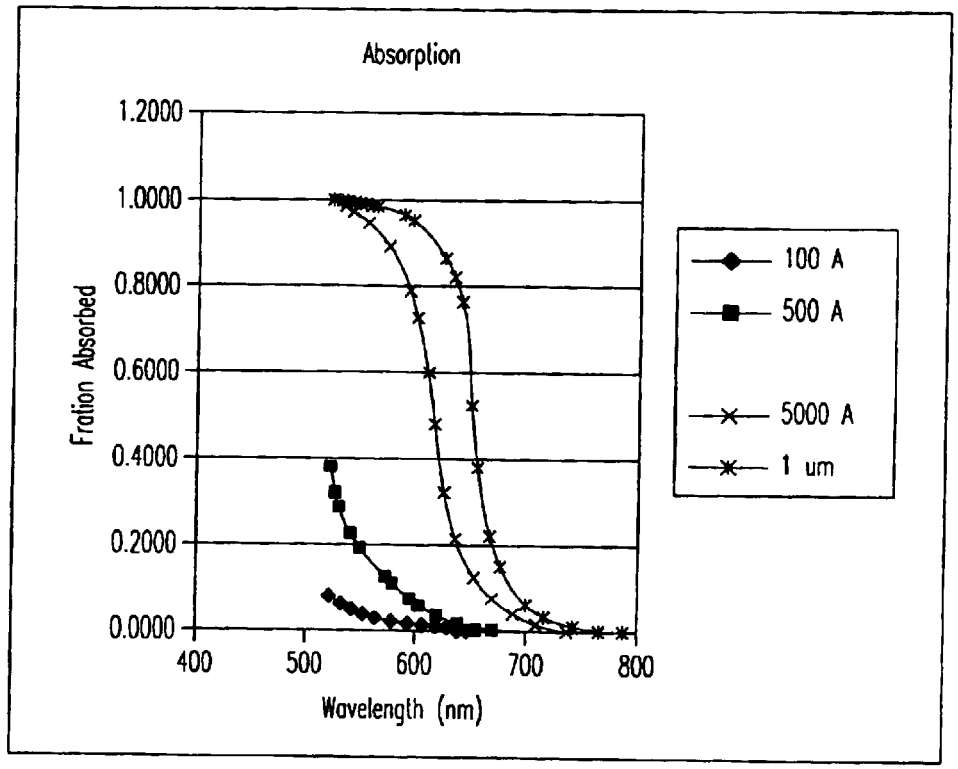
FIG. 3
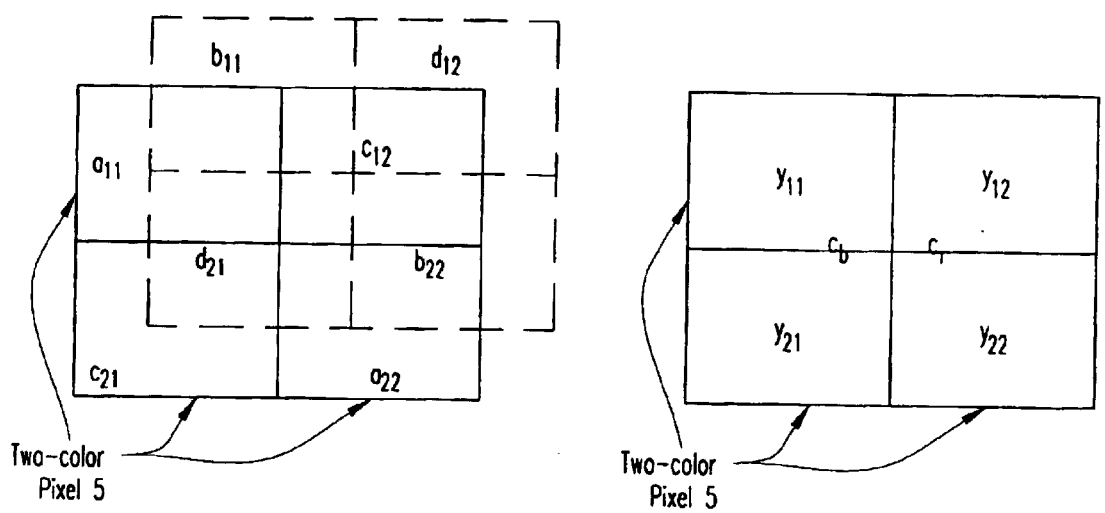
FIG. 4A
FIG. 4B

TWO-COLOR PHOTO-DETECTOR AND METHODS FOR DEMOSAICING A TWO-COLOR PHOTO-DETECTOR ARRAY

BACKGROUND OF THE INVENTION

1. Technical Field of the Invention

The present invention relates generally to digital color image sensors, and specifically to a two-color photo-detector capable of detecting two colors at a single photo-detector location and a method for demosaicing a two-color photo-detector array.

2. Description of Related Art

Digital color image sensors are predominately of two types: CCDs (Charge Coupled Devices) and CMOS—APS (Complimentary Metal Oxide Semiconductor—Active Photo-detector Sensors). Both types of sensors typically contain an array of photo-detectors (e.g., pixels), arranged in rows and columns or arranged in other patterns, that sample color within an image. Each photo-detector measures the intensity of light within one or more ranges of wavelengths, corresponding to one or more perceived colors.

In addition, both types of sensors may include a color filter array (CFA), such as the CFA described in U.S. Pat. No. 3,971,065 to Bayer (hereinafter referred to as Bayer), which is hereby incorporated by reference. With the Bayer CFA, each photo-detector sees only one wavelength range, corresponding to the color red, green or blue. To obtain the sensor values for all three primary colors at a single photo-detector, it is necessary to interpolate the color sensor values from adjacent photo-detectors. This process of interpolation is called demosaicing. Demosaiced images frequently exhibit color aliasing artifacts (distortion) due to the inherent under-sampling of color on an image sensor fitted with a CFA. In order to overcome some of the problems associated with color aliasing artifacts, alternative sensor designs have been proposed.

For example, in one alternative sensor design that does not use a CFA, a special prism separates and captures the three primary colors at the same photo-detector location, as is described by Richard F. Lyon in "Prism-Based Color Separation for Professional Digital Photography," Proceedings of 2000 PICS Conference, IS&T, p. 50–54, which is hereby incorporated by reference. However, the cost of the prism and optics is extremely high. In addition, the need to manually align, in both X and Y, the three sensors and optics to less than a fraction of the width of a photo-detector, which is on the order of 3 microns, is prohibitive for many imager applications.

Another type of sensor design is described in both U.S. Pat. No. 5,998,806 to Stiebig et al. and U.S. Pat. No. 5,965,875 to Merrill, which are both hereby incorporated by reference. The Stiebig et al. and Merrill sensors stack three separate color photodiodes, and electrically connect the photodiodes together to form one photo-detector capable of sensing all three primary colors at a single spatial location. However, both the Stiebig et al. sensor and Merrill sensor include common anodes, such that any current coming out of a three-color photo-detector location is a combination of more than one photodiode current (i.e., the photo-detectors are not electrically isolated from each other). Therefore, in order to measure the differences in current coming out of all three photodiodes, a significant amount of extra circuitry is required, which can be both cost prohibitive and area prohibitive.

A further alternative sensor design is described in an article by K. M. Findlater et al. entitled "Buried Double Junction Photo-detector Using Green and Magenta Filters," 1999 IEEE Workshop on CCDs and Advanced Image Sensors, pp. 60–64, which is hereby incorporated by reference. Instead of a "three color photo-detector," as described in Stiebig et al. and Merrill, the Findlater article describes a "two color photo-detector." In the Findlater sensor, each photo-detector includes two back to back photodiodes resident in the bulk silicon. In addition, a non-Bayer color filter array (CFA) mosaic covers the Findlater sensor. Thus, for every two photo-detectors, four different color values are extracted.

Although the Findlater design provides more accurate color reconstruction as compared to the conventional "Bayer" pattern, the color separation of the two bulk photodiodes is poor, since the absorption spectrum (i.e., sensitivity regions) of each of the sensors is fixed. In addition, with the Findlater design, the photo-detector itself is large due to the fact that two photodiodes and all of the circuitry for each photo-detector are integrated into the bulk silicon, adding both area and cost. What is needed is a new alternative sensor design that samples more than one color at each photo-detector location with improved color separation and reduced area as compared with the Findlater design and electrical isolation between the photo-detectors as compared with previous three-color sensor designs.

SUMMARY OF THE INVENTION

The present invention provides a sensor that includes a two-color photo-detector having a lower photo-detector element resident in the bulk silicon and an upper photo-detector element elevated above the lower photo-detector element. Therefore, the sensor can sample more than one color at each photo-detector location. The color sensitivity of each of the photo-detector elements is determined according to the absorption curve of the upper photo-detector element, the thickness of the upper photo-detector element and the color filter array, if any.

In some embodiments, the elevated upper photo-detector element can overlie the circuitry needed for both the upper photo-detector element and the lower photo-detector element. In other embodiments, in order to accurately sample color within an array of two-color photo-detectors without a color filter array, two different thicknesses for the upper photo-detector elements of adjacent two-color photo-detectors are used. Therefore, each pair of two-color photo-detectors within the array can sense four different colors (e.g., blue and the complement of blue and red and the complement of red).

In further embodiments, to process the raw color values for compression and storage, a color-conversion matrix can be used on a 2×2 block of two-color photo-detectors to convert the four colors (eight color values) to a new color space, such as YCbCr (4:1:1). Thus, instead of demosaicing with neighborhood operations to interpolate all four colors at each photo-detector location and then convert to the YCbCr (4:1:1) color space, a simpler method of demosaicing can be performed that does not involve any neighborhood operations, and allows a direct conversion to the YCbCr (4:1:1) color space from the raw color values themselves.

In addition, the two photo-detector elements in the two-color photo-detector are electrically isolated from each other, thereby improving the dynamic range of each photo-detector element. The electrical isolation between the two photo-detector elements may further improve the color separation between the two photo-detector elements. Furthermore, by elevating one of the photo-detector elements above the other photo-detector element and circuitry, the area for producing the two-color photo-detector may be reduced as compared with previous two-color sensor designs. Moreover, the invention provides embodiments with other features and advantages in addition to or in lieu of those discussed above. Many of these features and advantages are apparent from the description below with reference to the following drawings.

BRIEF DESCRIPTION OF THE DRAWINGS

The disclosed invention will be described with reference to the accompanying drawings, which show important sample embodiments of the invention and which are incorporated in the specification hereof by reference, wherein:

FIG. 3 is a chart of absorption percentage verses wavelength for varying thicknesses of amorphous silicon;

FIG. 4A illustrates the raw color values obtained from a 2×2 block of two-color photo-detectors;

FIG. 4B illustrates the result of demosaicing the raw color values shown in FIG. 4A, in accordance with embodiments of the present invention;

DETAILED DESCRIPTION OF THE EXEMPLARY EMBODIMENTS OF THE INVENTION

The numerous innovative teachings of the present application will be described with particular reference to the exemplary embodiments. However, it should be understood that these embodiments provide only a few examples of the many advantageous uses of the innovative teachings herein. In general, statements made in the specification do not necessarily delimit any of the various claimed inventions. Moreover, some statements may apply to some inventive features, but not to others.

Figure 1:
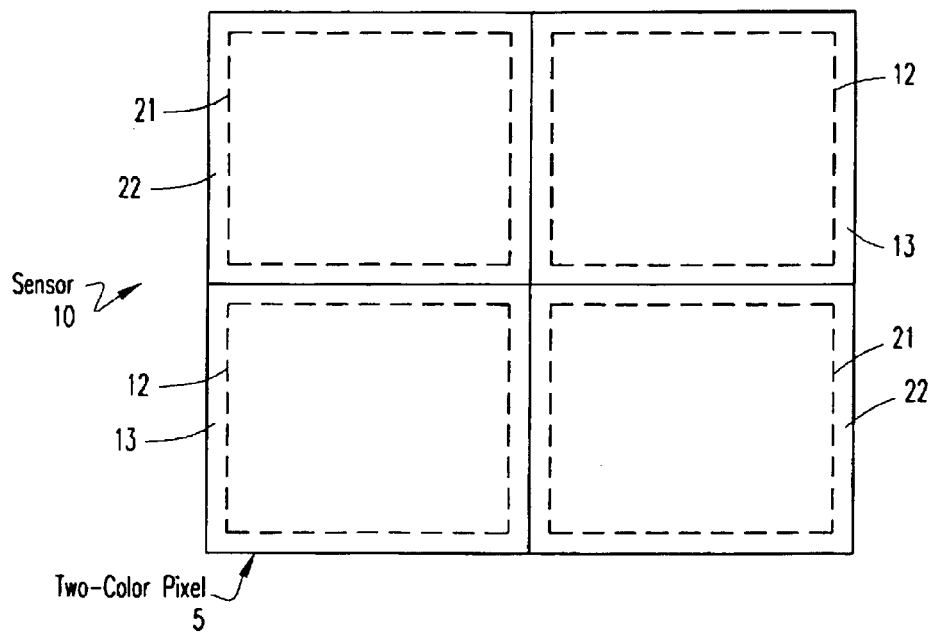
FIG. 1 illustrates an exemplary 2×2 block of photo-detectors for an array of two-color photo-detectors in accordance with embodiments of the present invention.
Figure 2:
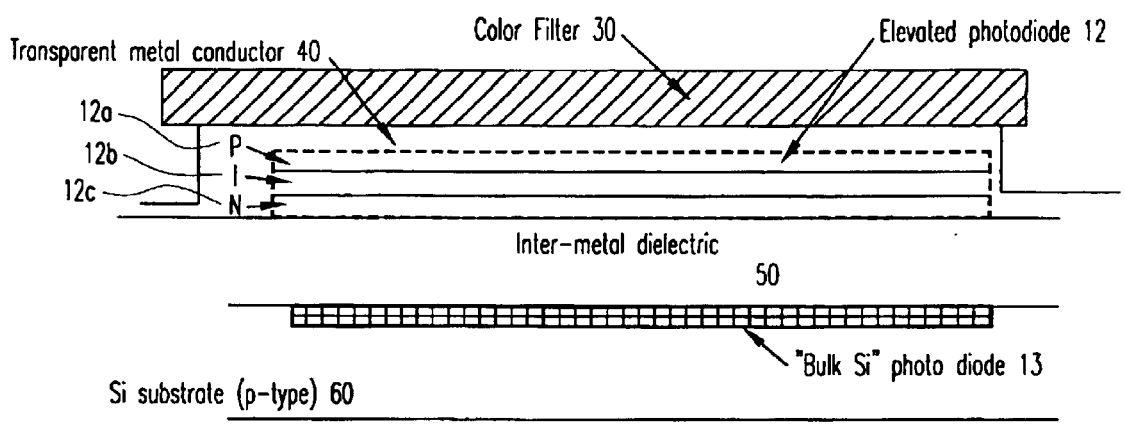
FIG. 2 is a cross-sectional view of a two-color photo-detector of the type shown in FIG. 1.

FIG. 1 illustrates an exemplary 2×2 block of two-color photo-detectors 5 (e.g., pixels) for a digital image sensor 10. In FIG. 2, within the area of four photo-detectors are eight photo-detector elements (i.e., photodiodes, photo-conductors or photo-transistors). Each of the photo-detectors is a two-color photo-detector 5 having two photo-detector elements, each detecting a different color. Within the 2×2 block of two-color photo-detectors 5, there are two types of two-color photo-detectors. One type of two-color photo-detector has first and second photo-detector elements 12 and 13 capable of absorbing light and collecting the resultant charge upon reception of light within first and second ranges of wavelengths, respectively (i.e., the complement of red and red). The other type of two-color photo-detector has third and fourth photo-detector elements 21 and 22 capable of absorbing light and collecting the resultant charge upon reception of light within third and fourth ranges of wavelengths, respectively (i.e., blue and the complement of blue). It should be understood that the photo-detector elements may be photo-conductors or photodiodes, as is understood in the art. Although the photo-detector elements 12 and 13 are discussed absorbing first and second ranges of wavelengths and the other two-color photo-detector elements 21 and 22 are discussed absorbing third and fourth ranges of wavelengths (e.g., red and blue wavelengths), it should be understood that any of the photo-detector elements can absorb any range of wavelengths depending upon the design and usage of the sensor 10. In addition, it should be understood that the respective wavelength ranges absorbed by the photo-detector elements 12 and 13 can partially overlap the wavelength range absorbed by the photo-detector elements 21 and 22 without any significant impact to the sensitivity of the sensor 10.

A single layer of the appropriate thickness of amorphous silicon (αSi:H) (illustrated by a dotted line) serves as the upper photo-detector element 12 or 21 of each two-color photo-detector. The lower photo-detector element 13 or 22 of each two-color photo-detector resides in bulk silicon (illustrated by a solid line). As can be seen, the upper photo-detector element 12 or 21 of each of the two-color photo-detectors is in an elevated relation (i.e., above and spaced apart from) with the lower photo-detector element 13 or 22 of each of the two-color photo-detectors. It should be noted that the upper photo-detector element may be formed of a material other than amorphous silicon.

However, using amorphous silicon for the upper photo-detector element of each two-color photo-detector provides independent control of both the upper 12 or 21 and lower 13 or 22 photo-detector elements. In addition, the use of amorphous silicon allows for a tunable color response, through the thickness of the amorphous silicon layer. In order to tune the color response of each two-color photo-detector, the thickness of the amorphous silicon layer of the upper photo-detector element 12 or 21 may be altered. For example, a thin amorphous silicon layer for the upper photo-detector element 12 would absorb only blue, while the bulk lower photo-detector element 13 below would absorb the compliment of blue (e.g., yellow). Alternatively, if the thickness of the amorphous silicon layer of the upper photo-detector element 12 is increased, the upper photo-detector element 12 would extract the compliment of red (e.g., cyan), while the bulk lower photo-detector element 13 below would absorb red.

A chart of the absorption percentage verses wavelength for varying thickness of the amorphous silicon layer is shown in FIG. 3. As can be seen in FIG. 3, a 5000 angstrom thick layer of amorphous silicon absorbs 100 percent of the blue portion of the spectrum (near 500 nm wavelength), between 40 and 80 percent of the green (between approximately 575 and 650 nm wavelength) and less than 20 percent of the red portion of the spectrum (between approximately 675 and 750 nm wavelength).

In the example shown in FIG. 1, no color filters are shown. However, it should be understood that color filters may be used to tune the response of the two-color photo-detectors 5. For example, one type of two-color photo-detector 5 may include a magenta filter, while the other type of two-color photo-detector 5 may include a cyan filter. The magenta filter passes only the red and blue portions of the spectrum to the two photo-detectors (i.e., photo-detectors 12 and 13). The blue portion of the spectrum would be absorbed by the upper photo-detector element 12, while the red portion of the spectrum would be absorbed by the lower photo-detector element 13. The cyan filter passes only the blue and green portions of the spectrum to the two-photodetectors (i.e., photo-detectors 21 and 22). The blue portion of the spectrum would be absorbed by the upper photo-detector element 21, while the green portion of the spectrum would be absorbed by the lower photo-detector element 22. However, it should be understood that other color filters may be used depending on the color space and color sampling desired for the sensor 10.

FIG. 2 is a cross-sectional view of an exemplary two-color photo-detector 5 of the type shown in FIG. 1. A color filter 30 is illustrated residing above a transparent metal conductor 40, such as indium tin oxide. Below the transparent metal conductor 40 is an elevated photodiode 12 having a P-layer 12a, an I-layer 12b and an N-layer 12c. When reverse biased, the elevated photodiode 12 collects charge when it receives light.

A dielectric 50 (illustrated as an inter-metal dielectric), such as silicon dioxide ($SiO_2$), separates the elevated photodiode from the bulk silicon photodiode 13. The dielectric 50 separates the anodes of two photodiodes 12 and 13 in order to separate the current coming out of each of the two photodiodes 12 and 13 (and therefore provide electric isolation between the photodiodes). The bulk silicon photodiode 13 is formed in the silicon substrate 60. A shallow N+ region is formed in the P-type silicon substrate 60 to provide detection of light having wavelengths that are longer than the wavelength of light detected by the elevated photodiode 12. In addition, although not shown, the circuitry for driving the elevated photodiode 12 and the bulk silicon photodiode 13 are resident within the bulk silicon adjacent to the bulk silicon photodiode 13.

To process the raw color values produced from a two-color photo-detector array for compression and storage purposes, several different types of demosaicing and color space conversion algorithms can be applied to the original raw color values. If color filters are used, any known demosaicing technique may be used to interpolate three color values (i.e., red, blue and green or cyan, magenta and yellow) at each photo-detector location. Since each photo-detector detects two of the three colors, the results from demosaicing should be more accurate than in a conventional Bayer CFA pattern. The raw and interpolated color values may be converted to another color space using any known conversion process.

When no color filters are used, each pair of two-color photo-detectors within the array senses four different colors (i.e., blue and the complement of blue and red and the complement of red). To process a 2×2 block of two-color photo-detectors, such as the one illustrated in FIG. 1, a new demosaicing technique is needed to interpolate the four color values and convert the color values into a color space suitable for compression, using for example, JPEG (Joint Photographic Experts Group). A discussion of the JPEG technique can be found in: W. Pennebaker and J. Mitchell, "JPEG: Still Image Data Compression Standard," New York: Van Nostrand Reinhold, 1993, which is hereby incorporated by reference.

As shown in FIGS. 4A and 4B, in one embodiment, the eight raw color values $a_{12}$, $a_{22}$, $b_{11}$, $b_{22}$, $c_{12}$, $c_{21}$, $d_{12}$ and $d_{21}$ produced by a 2×2 block of two-color photo-detectors 5 are converted directly to a new color space, such as YCbCr (4:1:1), which has color values $y_{11}$, $y_{12}$, $y_{21}$, $y_{22}$, cb and cr, without demosaicing. The four different colors (i.e. red and the complement of red and blue and the complement of blue) are denoted herein as A, B, C and D. Therefore, the configuration of the 2×2 block of two-color photo-detectors 5 shown in FIG. 4A is as follows:

Top Left photo-detector: Basis-function A, coefficient $a_{11}$, and Basis-func. B, coeff. $b_{11}$.
Top Right photo-detector. Basis-function C, coefficient $c_{12}$, and Basis-func. D, coeff. $d_{12}$.
Bottom Left photo-detector: Basis-function C, coefficient $c_{21}$, and Basis-func. D, coeff. $d_{21}$.
Bottom Right photo-detector: Basis-function A, coefficient $a_{22}$, and Basis-func. B, coeff. $b_{22}$.

Out of the above eight color values, six new color values, $y_{11}$, $y_{12}$, $y_{21}$, $y_{22}$, cb and cr are determined, as shown in FIG. 4B. Specifically, the new color values that need to be determined are as follows:

Top Left photo-detector: Basis-function Y, coefficient $y_{11}$.
Top Right photo-detector: Basis-function Y, coefficient $y_{12}$.
Bottom Left photo-detector: Basis-function Y, coefficient $y_{21}$.
Bottom Right photo-detector: Basis-function Y, coefficient $y_{22}$.
Center of photo-detectors: Basis-function Cb, coefficient $c_b$; and Basis-function Cr, coeff. $c_r$.

Figure 5:
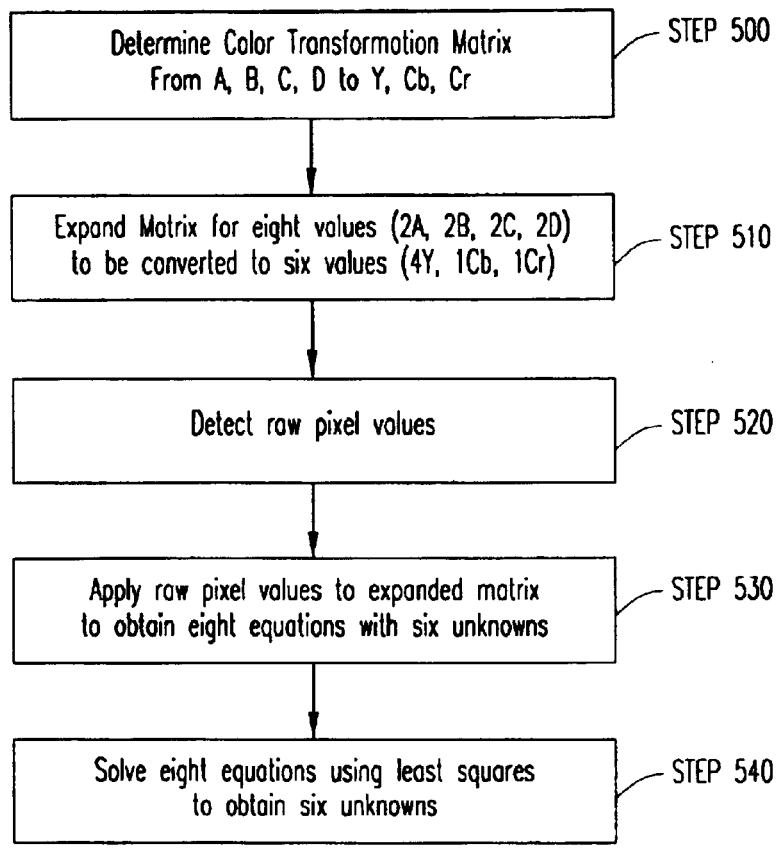
FIG. 5 is a flowchart illustrating exemplary steps of a direct inversion demosaicing method, in accordance with embodiments of the present invention.

FIG. 5 is a flowchart illustrating exemplary steps for performing the direct inversion demosaicing method shown in FIGS. 4A and 4B. Initially, a color transformation matrix from the ABCD space to the YCbCr space is created (step 500). The simplest method to derive the color transformation matrix is the maximum ignorance method, which needs only the spectral sensitivity curves of the basis functions (e.g., colors). To arrive at the color transformation matrix using the maximum ignorance method involves a simple pseudo-inverse computation. For example, as a result of the maximum ignorance method, the following 4×3 matrix (denoted [E]) is capable of transforming the four colors A, B, C and D to Y, Cb and Cr color values:

$$\begin{bmatrix} A \\ B \\ C \\ D \end{bmatrix} = \begin{bmatrix} E_{11} & E_{12} & E_{13} \\ E_{21} & E_{22} & E_{23} \\ E_{31} & E_{32} & E_{33} \\ E_{41} & E_{42} & E_{43} \end{bmatrix} * \begin{bmatrix} Y \\ Cb \\ Cr \end{bmatrix}$$

Since the human visual is less sensitive to high frequency changes in chrominance than in luminance, for a 2×2 block of two-color photo-detectors, which produces eight color values, an expanded version of the above matrix can convert these eight values into six values (e.g., four Y values, one Cr value and one Cx value) as follows (step 510):

$$\begin{bmatrix} a_{11} \\ b_{11} \\ c_{12} \\ d_{12} \\ a_{22} \\ b_{22} \\ c_{21} \\ d_{21} \end{bmatrix} = \begin{bmatrix} E_{11} & 0 & 0 & 0 & E_{12} & E_{13} \\ E_{21} & 0 & 0 & 0 & E_{22} & E_{23} \\ 0 & E_{31} & 0 & 0 & E_{32} & E_{33} \\ 0 & E_{41} & 0 & 0 & E_{42} & E_{43} \\ 0 & 0 & E_{11} & 0 & E_{12} & E_{13} \\ 0 & 0 & E_{21} & 0 & E_{22} & E_{23} \\ 0 & 0 & 0 & E_{31} & E_{32} & E_{33} \\ 0 & 0 & 0 & E_{41} & E_{42} & E_{43} \end{bmatrix} * \begin{bmatrix} y_{11} \\ y_{12} \\ y_{21} \\ y_{22} \\ c_B \\ c_R \end{bmatrix}$$

When the raw color values are obtained (step 520), the raw color values are applied to the above matrix (step 530). For example, as a result of applying the raw color values of the top left two-color photo-detector of FIG. 4A to the above matrix, the following equations are produced:

$a_{11} = E_{11}*y_{11} + E_{12}*c_b + E_{13}*c_r$ (Equation 1)

$b_{11} = E_{21}*y_{11} + E_{22}*c_b + E_{23}*c_r$ (Equation 2)

Applying the top right two-color photo-detector raw color values of FIG. 4A to the above expanded matrix produces the following equations:

$c_{12} = E_{31}*y_{12} + E_{32}*c_b + E_{33}*c_r$ (Equation 3)

$d_{12} = E_{41}*y_{12} + E_{42}*c_b + E_{43}*c_r$ (Equation 4)

Applying the bottom left two-color photo-detector raw color values of FIG. 4A to the above expanded matrix produces the following equations:

$$c_{21} = E_{31}*y_{21} + E_{32}*c_b + E_{33}*c_r \quad \text{(Equation 5)}$$

$$d_{21} = E_{41}*y_{21} + E_{42}*c_b + E_{43}*c_r \quad \text{(Equation 6)}$$

Finally, applying the bottom right two-color photo-detector raw color values of FIG. 4A to the above expanded matrix produces the following equations:

$$a_{22} = E_{11}*y_{22} + E_{12}*c_b + E_{13}*c_r \quad \text{(Equation 7)}$$

$$b_{22} = E_{21}*y_{22} + E_{22}*c_b + E_{23}*c_r \quad \text{(Equation 8)}$$

The above eight equations have six unknown values ($y_{11}$, $y_{12}$, $y_{21}$, $y_{22}$, $c_b$, $c_r$). These eight equations can be solved using least squares to obtain the six unknown values (step 540). It should be understood that other color spaces, such as Lab (or L*a*b*), may be used instead of the YCrCb discussed herein. It should be understood that for any new color space, the values are sampled in a 4:1:1 manner. That is, one of the components has four values, and the other two have only one.

Instead of demosaicing with neighborhood operations to interpolate all four colors at each photo-detector location and then convert to the YCbCr (4:1:1) color space from the raw color values themselves. As a result, such pre-compression image processing may be performed on the sensor itself, which reduces the amount of data that the sensor must output.

In another embodiment, edge weighted interpolation can be applied to the raw color values produced by an array of two-color photo-detectors. Within an image, there are many edges where the light intensity changes sharply. In order to produce a sharp output image, color interpolation should be directed along edges, rather than across them. In order to avoid interpolation across edges, for each photo-detector location, the edge weighted demosaicing method described below in connection with FIG. 7 determines whether that photo-detector lies on edge, and if so, estimates the orientation of that edge. It should be understood that the term "edge" herein refers to a photo-detector that produces a value that is associated with an object or other boundary of an image feature where the intensity changes sharply. The term "edge" does not refer to photo-detectors that lie on one of the four natural boundaries of an image (i.e., photo-detectors that lie on an edge of the sensor itself).

Figure 6:
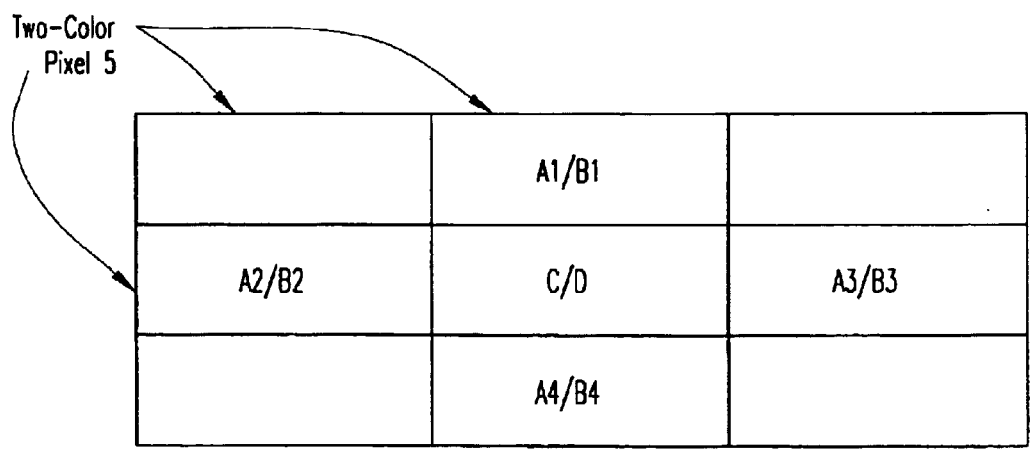
FIG. 6 illustrates the raw color values obtained from an array of two-color photo-detectors.

As shown in FIG. 6, in a two-color photo-detector array, a two-color photo-detector 5 that detects colors C and D is surrounded by four two-color photo-detectors 5 horizontally and vertically that detect colors A and B. For example, to interpolate the value of the color A at the C/D photo-detector location, the following equation can be applied:

$$A = \frac{(A_2 + A_3)/2 * A_y + (A_1 + A_4)/2 * A_x}{1 + A_x + A_y}, \quad \text{(Equation 9)}$$

where $A_x$ and $A_y$ are the gradients in the horizontal and vertical directions, namely:

$$A_x = abs((A3-A2)/2) \quad \text{(Equation 10)}$$

$$A_y = abs((A4-A1)/2) \quad \text{(Equation 11)}$$

Since edge weighted demosaicing interpolates from neighbors in the direction of least change to minimize the risk of blurring edges, if one of the gradients is larger than the other, a higher weight is assigned to the opposite pair of photo-detectors. For example, if the gradient in the horizontal direction is higher than the gradient in the vertical direction, a higher weight is assigned to $A_y$ than $A_x$. It should be understood that similar equations can be used to interpolate the B value at the C/D photo-detector location.

Figure 7:
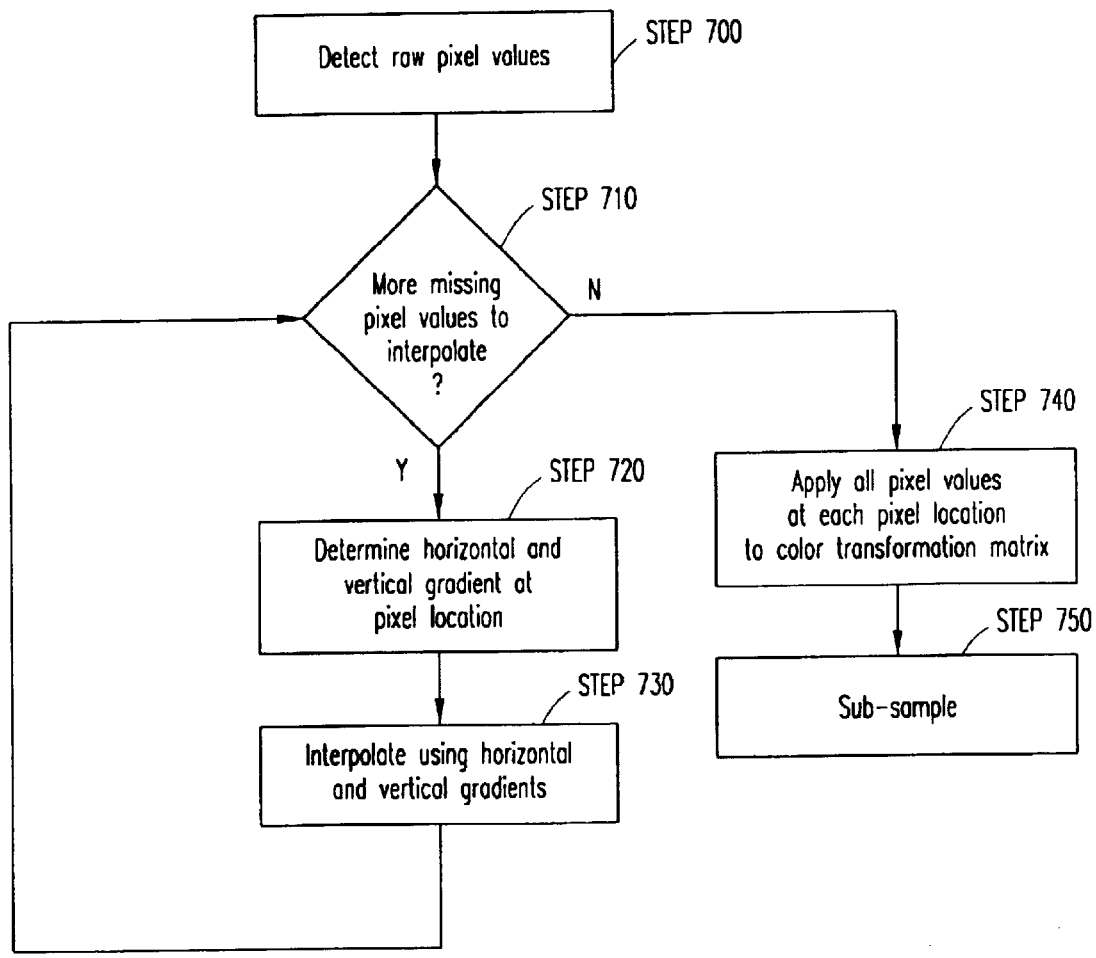
FIG. 7 is a flowchart illustrating exemplary steps of an edge-weighted demosaicing method, in accordance with embodiments of the present invention.

FIG. 7 is a flowchart illustrating exemplary steps of an edge-weighted demosaicing method. Once the raw color values are obtained (step 700), for each two-color photo-detector location (step 710), two color values are interpolated. Prior to interpolating the two missing color values from a photo-detector location, the horizontal and vertical gradients are ascertained (step 720), using Equations 10 and 11 above. Thereafter, an edge-weighted interpolation of the two missing values is performed (step 730), using Equation 9 above. All of the missing photo-detector values for each photo-detector location are calculated in a similar manner (steps 710–730).

Once there are four color values for each two-color photo-detector location (step 710), the four color values for each two-color photo-detector location can be applied to the following color transformation matrix, which is identical to the above described transformation matrix, to convert the four values of each two-color photo-detector to another color space, such as YCbCr (step 740):

$$\begin{bmatrix} A \\ B \\ C \\ D \end{bmatrix} = \begin{bmatrix} E_{11} & E_{12} & E_{13} \\ E_{21} & E_{22} & E_{23} \\ E_{31} & E_{32} & E_{33} \\ E_{41} & E_{42} & E_{43} \end{bmatrix} * \begin{bmatrix} Y \\ Cb \\ Cr \end{bmatrix},$$

where the matrix [E] is derived from the maximum ignorance method, which needs only the spectral sensitivity curves of the basis functions (e.g., colors). As a result of applying the matrix, each two-color photo-detector location has a Y value, a Cb value and a Cr value associated therewith. Additional sub-sampling of the Cb and Cr values, as is well-known in the art, is needed to complete the transformation into the YCbCr (4:1:1) color space (step 750).

Although the edge-weighted demosaicing method may produce sharper images than the direct inversion demosaicing method, the edge-weighted demosaicing method is not a closed operation on 2×2 photo-detectors. Therefore, the edge-weighted demosaicing method requires some buffering (i.e., two-line buffering) in order to demosaic the image.

As will be recognized by those skilled in the art, the innovative concepts described in the present application can be modified and varied over a wide range of applications. Accordingly, the scope of patented subject matter should not be limited to any of the specific exemplary teachings discussed, but is instead defined by the following claims.

We claim:

1. A digital image sensor, comprising:
    a first two-color photo-detector having a first photo-detector element designed for absorbing light and a second photo-detector element designed for absorbing only complement of blue light, said first photo-detector element being in an elevated relation with said second photo-detector element, said first photo-detector element being electrically isolated from said second photo-detector element; and
    a second two-color photo-detector having a third photo-detector element designed for absorbing only complement of red light and a fourth photo detector element designed for absorbing only red light, said third photo-detector element being in an elevated relation with said fourth photo-detector element, said third photo-detector element being electrically isolated from said fourth photo-detector element.

2. The sensor of claim 1, further comprising:
a substrate, said second photo-detector element being formed within said substrate.

3. The sensor of claim 2, further comprising:
a dielectric layer between said first photo-detector element and said second photo-detector element, said dielectric layer electrically isolating said first photo-detector element from said second photo-detector element.

4. The sensor of claim 1, wherein said first photo-detector element is formed of amorphous silicon having a thickness selected to absorb only said blue light and pass said complement of blue light.

5. The sensor of claim 1, wherein said first and second photo-detector elements are photodiodes.

6. The sensor of claim 5, wherein said photodiodes are PIN photodiodes.

7. The sensor of claim 1, further comprising:
a color filter in elevated relation with said first photo-detector element, said color filter absorbing light within a portion of said complement of blue light and passing the rest of said complement of blue light.

8. The sensor of claim 7, further comprising:
a transparent metal conductor layer between said color filter and said first photo-detector element.

9. The sensor of claim 1, further comprising:
circuitry for driving said first photo-detector element and said second photo-detector element, said first photo-detector element being in an elevated relation with said circuitry.

10. The sensor of claim 1, wherein said first photo-detector element produces a first color value, said second photo-detector element produces a second color value, third photo-detector element produces a third color value and said fourth photo-detector element produces a fourth color value, and further comprising:
a third two-color photo-detector having a fifth photo-detector element in an elevated relation with a sixth photo-detector element, said fifth photo-detector element being electrically isolated from said sixth photo-detector element, said fifth photo-detector element designed for absorbing only said blue light and producing a fifth color value, said sixth photo-detector element designed for absorbing only said complement of blue light and producing a sixth color value; and
a fourth two-color photo-detector having a seventh photo-detector element in an elevated relation with an eighth photo-detector element, said seventh photo-detector element being electrically isolated from said eighth photo-detector element, said seventh photo-detector element designed for absorbing only said complement of only red light and producing a seventh color value, said eighth photo-detector element designed for absorbing said red light and producing an eighth color value.

11. The sensor of claim 1, wherein said first photo-detector element is formed of amorphous silicon having a first thickness selected to absorb only said blue light and said third photo-detector element is formed of amorphous silicon having a second thickness selected to absorb only said complement of red light.

12. A digital image sensor, comprising:
a first two-color photo-detector having a first photo-detector element designed for absorbing only blue light and a second photo-detector element designed for absorbing only complement of blue light, said first photo-detector element being in an elevated relation with said second photo-detector element;
a first dielectric layer between said first photo-detector element and said second photo-detector element;
a second two-color photo-detector having a third photo-detector element designed for absorbing only complement of red light and a fourth photo detector element designed for absorbing only red light, said third photo-detector element being in an elevated relation with said fourth photo-detector element; and
a second dielectric layer between said third photo-detector element and said fourth photo-detector element.

13. The sensor of claim 12, further comprising:
a substrate, said second photo-detector element being formed within said substrate.

14. The sensor of claim 12, wherein said first photo-detector element is formed of amorphous silicon having a thickness selected to absorb only said blue light and pass said complement of blue light.

15. The sensor of claim 12, further comprising:
a color filter in an elevated relation with said first photo-detector element, said color filter absorbing light within a portion of said complement of blue light and passing the rest of said complement of blue light.

16. The sensor of claim 15, further comprising:
a transparent metal conductor layer between said color filter and said first photo-detector element.

17. The sensor of claim 12, further comprising:
circuitry for driving said first photo-detector element and said second photo-detector element, said first photo-detector element being in an elevated relation with said circuitry.

18. The sensor of claim 12, wherein said first photo-detector element is formed of amorphous silicon having a first thickness selected to absorb only said blue light and said third photo-detector element is formed of amorphous silicon having a second thickness selected to absorb only said complement of red light.

* * * * *